United States Patent
Koide

(10) Patent No.: US 7,366,005 B2
(45) Date of Patent: Apr. 29, 2008

(54) FERROELECTRIC MEMORY DEVICE AND DISPLAY-DRIVING IC

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 147 days.

(21) Appl. No.: 11/445,411

(22) Filed: Jun. 1, 2006

(65) Prior Publication Data
US 2006/0291270 A1 Dec. 28, 2006

(30) Foreign Application Priority Data
Jun. 22, 2005 (JP) ............................. 2005-182619
Feb. 17, 2006 (JP) ............................. 2006-041441

(51) Int. Cl.
*G11C 11/22* (2006.01)
(52) U.S. Cl. ...................... 365/145; 365/117
(58) Field of Classification Search ................ 365/145, 365/117, 210, 207
See application file for complete search history.

(56) References Cited

U.S. PATENT DOCUMENTS

| | | | | |
|---|---|---|---|---|
| 5,663,904 | A * | 9/1997 | Arase ......................... | 365/145 |
| 5,844,832 | A | 12/1998 | Kim | |
| 6,055,200 | A * | 4/2000 | Choi et al. .................. | 365/201 |
| 6,574,135 | B1 * | 6/2003 | Komatsuzaki .............. | 365/145 |
| 6,771,531 | B2 | 8/2004 | Nishihara | |
| 2004/0208041 | A1 | 10/2004 | Maruyama | |

FOREIGN PATENT DOCUMENTS

| | | |
|---|---|---|
| JP | 2004-220739 | 8/2004 |
| KR | 1998-018220 | 6/1998 |

\* cited by examiner

*Primary Examiner*—Anh Phung
(74) *Attorney, Agent, or Firm*—Harness, Dickey & Pierce, P.L.C.

(57) ABSTRACT

A ferroelectric memory device including: a first bit line which extends, from one end toward another end thereof, in a first direction; a plurality of first memory cells, which are connected to the first bit line and store predetermined data; a second bit line which extends, from one end toward another end thereof, in a second direction, which is a direction substantially opposite to the first direction; a plurality of second memory cells, which are connected to the second bit line and store predetermined data; a sense amplifier, which is connected to the one end of the first bit line and the one end of the second bit line, and which amplifies data which have been stored at the first memory cells and the second memory cells; a latch circuit, which is connected to the other end of the first bit line, and which latches data that the sense amplifier has amplified; a data bus, which transfers data which are to be stored at the first memory cells and the second memory cells; and a first switch, which is connected to the other end of the second bit line and which switches between connecting and not connecting the second bit line with the data bus.

12 Claims, 4 Drawing Sheets

FERROELECTRIC MEMORY DEVICE AND DISPLAY-DRIVING IC

The entire disclosures of Japanese Patent Application No. 2005-182619, filed Jun. 22, 2005, and Japanese Patent Application No. 2006-41441, filed Feb. 17, 2006, are expressly incorporated by reference herein.

BACKGROUND

1. Technical Field

The present invention relates to a ferroelectric memory device and a display-driving IC.

2. Related Art

Previous ferroelectric memory devices include the device disclosed in JP-A-2004-220739. In this previous ferroelectric memory device, a column decoder is provided at one end of main bit lines, and reads data from ferroelectric capacitors in batches.

However, in this previous ferroelectric memory device, sense amplifiers and a writing circuit are connected at bottom ends of the bit lines, and data latch circuits are connected at top ends of the bit lines. Consequently, in this previous ferroelectric memory device, memory cells must be arranged alternately between corresponding bit lines, and a problem arises with a level of integration of the memory cells being lowered.

SUMMARY

An object of some aspects of the invention is the provision of a ferroelectric memory device and a driving IC for a display, which are capable of resolving the problem described above. This object is achieved by combinations of features recited in the attached independent claims. Dependent claims further define advantageous specific examples of the invention.

A ferroelectric memory device relating to one aspect of the invention includes a first bit line and a plurality of first memory cells, a second bit line and a plurality of second memory cells, a sense amplifier, a latch circuit, a data bus, and a first switch. The first bit line extends, from one end toward another end thereof, in a first direction, and the second bit line extends, from one end toward another end thereof, in a second direction, which is a direction substantially opposite to the first direction. The plurality of first memory cells are connected to the first bit line and store predetermined data, and the plurality of second memory cells are connected to the second bit line and store predetermined data. The sense amplifier is connected to the one end of the first bit line and the one end of the second bit line, and amplifies data which have been stored at the first memory cells and the second memory cells. The latch circuit is connected to the other end of the first bit line, and latches data that the sense amplifier has amplified. The data bus transfers data which are to be stored at the first memory cells and the second memory cells. The first switch is connected to the other end of the second bit line, and switches between connecting and not connecting the second bit line with the data bus.

A ferroelectric memory device relating to another aspect of the invention includes: a first bit line, a second bit line, a third bit line and a fourth bit line; pluralities of first memory cells, second memory cells, third memory cells and fourth memory cells; a first sense amplifier and a second sense amplifier; a latch circuit; and a switch. The first bit line extends, from one end toward another end thereof, in a first direction, and the second bit line extends, from one end toward another end thereof, in a second direction, which is a direction substantially opposite to the first direction. The first memory cells are connected to the first bit line and store predetermined data, and the second memory cells are connected to the second bit line and store predetermined data. The third bit line extends, from one end toward another end thereof, in the first direction, and the fourth bit line extends, from one end toward another end thereof, in the second direction. The third memory cells are connected to the third bit line and store predetermined data, and the fourth memory cells are connected to the fourth bit line and store predetermined data. The first sense amplifier is connected to the one end of the first bit line and the one end of the second bit line, and amplifies data which have been stored at the first memory cells and the second memory cells. The second sense amplifier is connected to the one end of the third bit line and the one end of the fourth bit line, and amplifies data which have been stored at the third memory cells and the fourth memory cells. The latch circuit is connected to the other end of the first bit line, and latches data that either of the sense amplifiers has amplified. The switch is connected to the other end of the second bit line and the other end of the third bit line, and switches between connecting and not connecting the second bit line with the third bit line.

A ferroelectric memory device relating to still another aspect of the invention includes: a first bit line, a second bit line, a third bit line and a fourth bit line; pluralities of first memory cells, second memory cells, third memory cells and fourth memory cells; a first sense amplifier and a second sense amplifier; a data line; and a latch circuit. The first bit line extends, from one end toward another end thereof, in a first direction, and the second bit line extends, from one end toward another end thereof, in a second direction, which is a direction substantially opposite to the first direction. The first memory cells are connected to the first bit line and store predetermined data, and the second memory cells are connected to the second bit line and store predetermined data. The third bit line extends, from one end toward another end thereof, in the first direction, and the fourth bit line extends, from one end toward another end thereof, in the second direction. The third memory cells are connected to the third bit line and store predetermined data, and the fourth memory cells are connected to the fourth bit line and store predetermined data. The first sense amplifier is connected to the one end of the first bit line and the one end of the second bit line, and amplifies data which have been stored at the first memory cells and the second memory cells. The second sense amplifier is connected to the one end of the third bit line and the one end of the fourth bit line, and amplifies data which have been stored at the third memory cells and the fourth memory cells. The data line extends, from one end toward another end thereof, in the first direction, is connected to the first sense amplifier via a switch, and is connected to the second sense amplifier via a switch. The latch circuit is connected to the other end of the data line, and latches data that either of the sense amplifiers has amplified.

A ferroelectric memory device relating to yet another aspect of the invention includes a first bit line and a second bit line, pluralities of first sub-bit lines and second sub-bit lines, pluralities of first memory cells and second memory cells, a sense amplifier, and a latch circuit. The first bit line extends, from one end toward another end thereof, in a first direction, and the second bit line extends, from one end toward another end thereof, in a second direction, which is a direction substantially opposite to the first direction. The first sub-bit lines are connected to the first bit line, and the second sub-bit lines are connected to the second bit line. The first memory cells are connected to the first sub-bit lines and store predetermined data, and the second memory cells are connected to the second sub-bit lines and store predetermined data. The sense amplifier is connected to the one end of the first bit line and the one end of the second bit line, and amplifies data which have been stored at the first memory cells and the second memory cells. The latch circuit is connected to the other end of the first bit line, and latches data that the sense amplifier has amplified.

Display-driving ICs relating to aspects of the invention are provided with the above-described ferroelectric memory devices.

Figure 1:
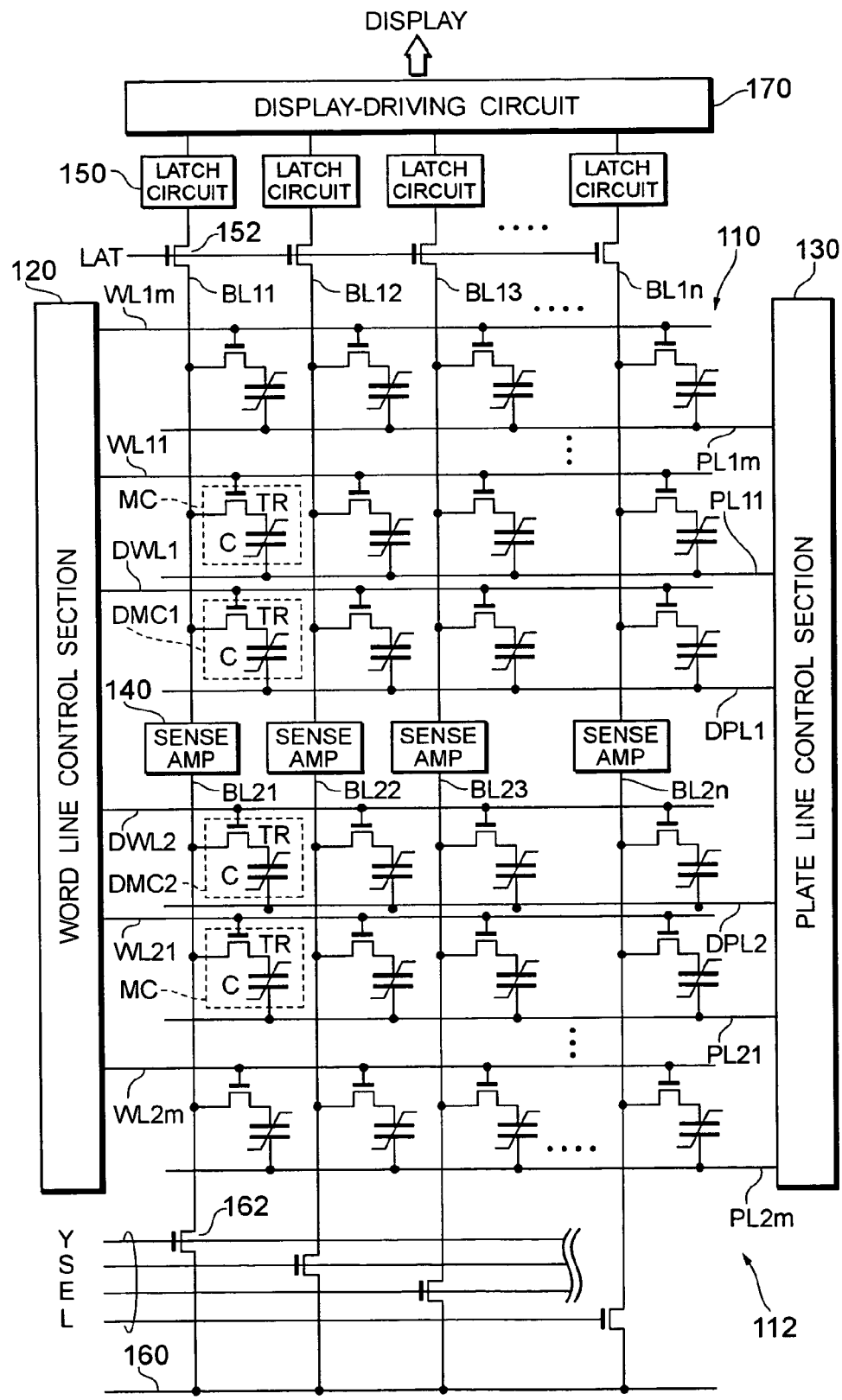
FIG. 1 is a diagram showing structure of a display-driving IC relating to a first embodiment of the invention.

DETAILED DESCRIPTION (1) According to one mode of the invention, a ferroelectric memory device including a first bit line and a plurality of first memory cells, a second bit line and a plurality of second memory cells, a sense amplifier, a latch circuit, a data bus, and a first switch is provided. The first bit line extends, from one end toward another end thereof, in a first direction, and the second bit line extends, from one end toward another end thereof, in a second direction, which is a direction substantially opposite to the first direction. The plurality of first memory cells are connected to the first bit line and store predetermined data, and the plurality of second memory cells are connected to the second bit line and store predetermined data. The sense amplifier is connected to the one end of the first bit line and the one end of the second bit line, and amplifies data which have been stored at the first memory cells and the second memory cells. The latch circuit is connected to the other end of the first bit line, and latches data that the sense amplifier has amplified. The data bus transfers data which are to be stored at the first memory cells and the second memory cells. The first switch is connected to the other end of the second bit line, and switches between connecting and not connecting the second bit line with the data bus.

In the mode described above, the first bit line and second bit line connected to the sense amplifier extend in substantially opposite directions to one another. Consequently, according to the above mode, arrangement spacings of the plurality of first memory cells and the plurality of second memory cells, in the first direction and the second direction, can be tightened. Thus, a ferroelectric memory device with a higher level of integration can be provided.

Furthermore, in the above mode, particularly in comparison with a folded-bit line architecture in which a first bit line and a second bit line which are connected to a sense amplifier extend in the same direction, lengths of the first bit line and the second bit line can be substantially halved. Therefore, it is possible to lower bit line capacitances, and potential differences between the bit lines can be increased. Hence, it is possible to provide a ferroelectric memory device which operates at high speed with low power consumption.

(2) The above ferroelectric memory device may further include a first dummy cell, which is connected to the first bit line between the sense amplifier and the first memory cells, and a second dummy cell, which is connected to the second bit line between the sense amplifier and the second memory cells. The sense amplifier may amplify data which have been stored at the first memory cells by reference to the second dummy cell, and amplify data which have been stored at the second memory cells by reference to the first dummy cell.

In the above mode, because the dummy cells are connected to the first bit line and the second bit line, respectively, there is no need to separately provide a bit line for referencing. Therefore, according to the above mode, even in a case of use at a device whose size in a word line direction is fixed, such as, for example, a display-driving IC or the like, spacings between the bit lines can be satisfactorily assigned.

(3) The above ferroelectric memory device may further include a second switch, which is provided between the first bit line and the latch circuit. The first switch may be turned on when the sense amplifier amplifies data which have been stored at the first memory cells, and the second switch may be turned on when the sense amplifier amplifies data which have been stored at the second memory cells.

According to the above mode, it is possible to control capacitances that are applied to the first bit line and the second bit line. Thus, it is possible to generate reference potentials from dummy cells with forms the same as the memory cells, and it is possible to suppress changes in characteristics due to variations in processing of the dummy cells.

(4) A ferroelectric memory device relating to another mode of the invention includes: a first bit line, a second bit line, a third bit line and a fourth bit line; pluralities of first memory cells, second memory cells, third memory cells and fourth memory cells; a first sense amplifier and a second sense amplifier; a latch circuit; and a switch. The first bit line extends, from one end toward another end thereof, in a first direction, and the second bit line extends, from one end toward another end thereof, in a second direction, which is a direction substantially opposite to the first direction. The first memory cells are connected to the first bit line and store predetermined data, and the second memory cells are connected to the second bit line and store predetermined data. The third bit line extends, from one end toward another end thereof, in the first direction, and the fourth bit line extends, from one end toward another end thereof, in the second direction. The third memory cells are connected to the third bit line and store predetermined data, and the fourth memory cells are connected to the fourth bit line and store predetermined data. The first sense amplifier is connected to the one end of the first bit line and the one end of the second bit line, and amplifies data which have been stored at the first memory cells and the second memory cells. The second sense amplifier is connected to the one end of the third bit line and the one end of the fourth bit line, and amplifies data which have been stored at the third memory cells and the fourth memory cells. The latch circuit is connected to the other end of the first bit line, and latches data that either of the sense amplifiers has amplified. The switch is connected to the other end of the second bit line and the other end of the third bit line, and switches between connecting and not connecting the second bit line with the third bit line.

In the above mode, the first and second bit lines connected to the first sense amplifier extend in substantially opposite directions to one another, and the third and fourth bit lines connected to the second sense amplifier extend in substantially opposite directions to one another. Consequently, according to the above mode, arrangement spacings of the pluralities of first to fourth memory cells, in the first direction and the second direction, can be tightened. Thus, a ferroelectric memory device with a higher level of integration can be provided.

Furthermore, in the above mode, in comparison with a folded-bit line architecture in which respective bit lines connected to respective sense amplifiers extend in the same direction, lengths of respective bit lines can be substantially halved. Therefore, it is possible to lower bit line capacitances, and potential differences between the bit lines can be increased. Hence, it is possible to provide a ferroelectric memory device which operates at high speed with low power consumption.

(5) The above ferroelectric memory device may further include: a data bus, which transfers data which are to be stored at the first to fourth memory cells; a first switch, which is connected to the other end of the fourth bit line and which switches between connecting and not connecting the data bus with the fourth bit line; and a second switch, which is provided between the first bit line and the latch circuit.

(6) The above ferroelectric memory device may further include a first dummy cell, which is connected to the first bit line, a second dummy cell, which is connected to the second bit line, a third dummy cell, which is connected to the third bit line, and a fourth dummy cell, which is connected to the fourth bit line. The first sense amplifier may amplify data which have been stored at the first memory cells by reference to the second dummy cell, and amplify data which have been stored at the second memory cells by reference to the first dummy cell. The second sense amplifier may amplify data which have been stored at the third memory cells by reference to the fourth dummy cell, and amplify data which have been stored at the fourth memory cells by reference to the third dummy cell.

In the above mode, because the dummy cells are connected to the respective bit lines, there is no need to separately provide a bit line for referencing. Therefore, according to the above mode, even in a case of use at a device whose size in a word line direction is fixed, such as, for example, a display-driving IC or the like, spacings between the bit lines can be satisfactorily assigned.

(7) A ferroelectric memory device relating to yet another mode of the invention includes: a first bit line, a second bit line, a third bit line and a fourth bit line; pluralities of first memory cells, second memory cells, third memory cells and fourth memory cells; a first sense amplifier and a second sense amplifier; a data line; and a latch circuit. The first bit line extends, from one end toward another end thereof, in a first direction, and the second bit line extends, from one end toward another end thereof, in a second direction, which is a direction substantially opposite to the first direction. The first memory cells are connected to the first bit line and store predetermined data, and the second memory cells are connected to the second bit line and store predetermined data. The third bit line extends, from one end toward another end thereof, in the first direction, and the fourth bit line extends, from one end toward another end thereof, in the second direction. The third memory cells are connected to the third bit line and store predetermined data, and the fourth memory cells are connected to the fourth bit line and store predetermined data. The first sense amplifier is connected to the one end of the first bit line and the one end of the second bit line, and amplifies data which have been stored at the first memory cells and the second memory cells. The second sense amplifier is connected to the one end of the third bit line and the one end of the fourth bit line, and amplifies data which have been stored at the third memory cells and the fourth memory cells. The data line extends, from one end toward another end thereof, in the first direction, is connected to the first sense amplifier via a switch, and is connected to the second sense amplifier via a switch. The latch circuit is connected to the other end of the data line, and latches data that either of the sense amplifiers has amplified.

In the above mode, the first and second bit lines connected to the first sense amplifier extend in substantially opposite directions to one another, and the third and fourth bit lines connected to the second sense amplifier extend in substantially opposite directions to one another. Consequently, according to the above mode, arrangement spacings of the pluralities of first to fourth memory cells, in the first direction and the second direction, can be tightened. Thus, a ferroelectric memory device with a higher level of integration can be provided.

Furthermore, in the above mode, in comparison with a folded-bit line architecture in which respective bit lines connected to respective sense amplifiers extend in the same direction, lengths of respective bit lines can be substantially halved. Therefore, it is possible to lower bit line capacitances, and potential differences between the bit lines can be increased. Hence, it is possible to provide a ferroelectric memory device which operates at high speed with low power consumption.

(8) The above ferroelectric memory device may further include: a data bus, which transfers data which are to be stored at the first to fourth memory cells; a first switch, which is connected to the one end of the data line and which switches between connecting and not connecting the data line with the data bus; and a second switch, which is provided between the data line and the latch circuit.

(9) The above ferroelectric memory device may further include a first dummy cell, which is connected to the first bit line, a second dummy cell, which is connected to the second bit line, a third dummy cell, which is connected to the third bit line, and a fourth dummy cell, which is connected to the fourth bit line. The first sense amplifier may amplify data which have been stored at the first memory cells by reference to the second dummy cell, and amplify data which have been stored at the second memory cells by reference to the first dummy cell. The second sense amplifier may amplify data which have been stored at the third memory cells by reference to the fourth dummy cell, and amplify data which have been stored at the fourth memory cells by reference to the third dummy cell.

In the above mode, because the dummy cells are connected to the respective bit lines, there is no need to separately provide a bit line for referencing. Therefore, according to the above mode, even in a case of use at a device whose size in a word line direction is fixed, such as, for example, a display-driving IC or the like, spacings between the bit lines can be satisfactorily assigned.

(10) A ferroelectric memory device relating to still another mode of the invention includes a first bit line and a second bit line, pluralities of first sub-bit lines and second sub-bit lines, pluralities of first memory cells and second memory cells, a sense amplifier, and a latch circuit. The first bit line extends, from one end toward another end thereof, in a first direction, and the second bit line extends, from one end toward another end thereof, in a second direction, which is a direction substantially opposite to the first direction. The first sub-bit lines are connected to the first bit line, and the second sub-bit lines are connected to the second bit line. The first memory cells are connected to the first sub-bit lines and store predetermined data, and the second memory cells are connected to the second sub-bit lines and store predetermined data. The sense amplifier is connected to the one end of the first bit line and the one end of the second bit line, and amplifies data which have been stored at the first memory cells and the second memory cells. The latch circuit is connected to the other end of the first bit line, and latches data that the sense amplifier has amplified.

In the above mode, the first and second bit lines connected to the sense amplifier extend in substantially opposite directions to one another. Consequently, according to the above mode, arrangement spacings of the pluralities of first and second memory cells, in the first direction and the second direction, can be tightened. Thus, a ferroelectric memory device with a higher level of integration can be provided.

Furthermore, in the above mode, in comparison with a folded-bit line architecture in which respective bit lines connected to a sense amplifier extend in the same direction, lengths of respective bit lines can be substantially halved. Therefore, it is possible to lower bit line capacitances, and potential differences between the bit lines can be increased. Hence, it is possible to provide a ferroelectric memory device which operates at high speed with low power consumption.

Further, because a plurality of sub-bit lines SBL are connected to each bit line BL, it is possible to further lower capacitances that are applied to the bit lines BL. Therefore, it is additionally possible to provide a ferroelectric memory device which operates at high speed with a large reading margin.

(11) The above ferroelectric memory device may further include: a data bus, which transfers data which are to be stored at the first and second memory cells; a first switch, which is connected to the other end of the second bit line and which switches between connecting and not connecting the second bit line with the data bus; and a second switch, which is provided between the first bit line and the latch circuit.

(12) The above ferroelectric memory device may further include a first dummy cell, which is connected to the first bit line, and a second dummy cell, which is connected to the second bit line. The sense amplifier may amplify data which have been stored at the first memory cells by reference to the second dummy cell, and amplify data which have been stored at the second memory cells by reference to the first dummy cell.

In the above mode, because the dummy cells are connected to the respective bit lines, there is no need to separately provide a bit line for referencing. Therefore, according to the above mode, even in a case of use at a device whose size in a word line direction is fixed, such as, for example, a display-driving IC or the like, spacings between the bit lines can be satisfactorily assigned.

(13) A display-driving IC relating to an mode of the present invention is provided with an above-described ferroelectric memory device. A "display-driving IC" means a general-purpose device for driving a display device such as, for example, a liquid crystal display device or the like.

Herebelow, the invention will be described through embodiments of the invention, with reference to the drawings. The following embodiments do not limit the invention relating to the attached claims. Moreover, the combinations of features described in the embodiments are not necessarily all required in means for effecting the invention.

FIRST EMBODIMENT

FIG. 1 is a diagram showing structure of a display-driving IC relating to the present embodiment. The display-driving IC of the present embodiment is a structure which includes a ferroelectric memory device and a display-driving circuit 170. The display-driving circuit 170 drives a device including a display such as, for example, a liquid crystal display or the like on the basis of data which is stored at the ferroelectric memory device.

The ferroelectric memory device is a structure which includes: memory cell arrays 110 and 112; a word line control section 120; a plate line control section 130; sense amplifiers 140; latch circuits 150; n-type MOS transistors 152, which are examples of the second switch; a data bus 160; n-type MOS transistors 162, which are examples of the first switch; pluralities of bit lines BL11 to BL1$n$ and BL21 to BL2$n$ ($n$ being an integer of at least two; these are below referred to as bit lines BL); pluralities of word lines WL11 to WL1$m$ and WL21 to WL2$m$ ($m$ being an integer of at least two; these are below referred to as word lines WL); pluralities of plate lines PL11 to PL1$m$ and PL21 to PL2$m$ (below referred to as plate lines PL); and dummy word lines DWL1 and DWL2 and dummy plate lines DPL1 and DPL2.

The display-driving IC of the present embodiment stores data supplied from outside the display-driving IC through the data bus 160 to memory cells MC provided in the memory cell arrays 110 and 112. Hence, the latch circuits 150 latch data that are read from the memory cells MC, and the display-driving circuit 170 drives the external display on the basis of the data that have been latched at the latch circuits 150.

The memory cell arrays 110 and 112 are structures which include pluralities of the memory cells MC and pluralities of dummy cells DMC, arranged in arrays. At the memory cell arrays 110 and 112, the word lines WL are arranged in parallel with the plate lines PL, and are arranged to be perpendicular with the bit lines BL. Thus, in the memory cell arrays 110 and 112, each memory cell is connected to one each of the word lines WL, the plate lines PL and the bit lines BL.

Each memory cell MC is a structure which includes an n-type MOS transistor TR and a ferroelectric capacitor C. One of the source and the drain of the n-type MOS transistor TR is connected to one of the bit lines BL, and the other thereof is connected to one terminal of the ferroelectric capacitor C. The gate of the n-type MOS transistor TR is connected to one of the word lines WL. Thus, whether or not the one terminal of the ferroelectric capacitor C is connected with the corresponding bit line BL switches in accordance with a potential of the word line WL.

The other terminal of the ferroelectric capacitor C is connected to one of the plate lines PL. Thus, the ferroelectric capacitor C stores a predetermined datum in accordance with a potential difference between the corresponding bit line BL and plate line PL, that is, a potential difference between the one terminal and the other terminal of the ferroelectric capacitor C.

In the memory cell arrays 110 and 112, respectively, dummy cells DMC1 and DMC2 are connected to the bit lines BL, dummy word lines DWL1 and DWL2, and dummy plate lines DPL1 and DPL2. The dummy cells DMC have similar structures to the memory cells MC, and are disposed in the memory cell arrays 110 and 112 between regions at which the memory cells MC are disposed and the sense amplifiers 140. That is, in the memory cell arrays 110 and 112, the dummy cells DMC are connected to the bit lines BL at positions which are closer to the sense amplifiers 140 than the memory cells MC.

The word line control section 120 controls voltages of the word lines WL and the dummy word lines DWL1 and DWL2, thus turning the n-type MOS transistors TR on and off. The plate line control section 130 controls voltages of the plate lines PL and the dummy plate lines DPL1 and DPL2, thus controlling voltages of the other terminals of the ferroelectric capacitors C.

The sense amplifiers 140 amplify data which have been stored at the memory cells MC, on the basis of charges released to the bit lines BL from the respective ferroelectric capacitors C. The sense amplifiers 140 of the present embodiment are latch-type sense amplifiers each including one terminal and another terminal. The bit lines BL11 to BL1n are connected to the one terminals and the bit lines BL21 to BL2n are connected to the other terminals. The bit lines BL11 to BL1n extend in the first direction, from the sense amplifiers 140 towards the latch circuits 150, and the bit lines BL21 to BL2n extend in the second direction, which is a direction substantially opposite to the first direction.

When data stored at the memory cells MC of the memory cell array 110 are being read, the sense amplifiers 140 amplify the data stored at those memory cells MC in accordance with charges released from data of the dummy cells DMC2 of the memory cell array 112, and when data stored at the memory cells MC of the memory cell array 112 are being read, the sense amplifiers 140 amplify the data stored at those memory cells MC in accordance with charges released from data of the dummy cells DMC1 of the memory cell array 110. In other words, the ferroelectric memory device of the present embodiment has an open bit line architecture.

The latch circuits 150 latch the data that have been amplified by the sense amplifiers 140, and the latch circuits 150 supply the latched data to the display-driving circuit 170. The display-driving circuit 170 drives the externally provided display on the basis of the data supplied from the latch circuits 150.

The n-type MOS transistors 152 are disposed between the latch circuits 150 and the bit lines BL11 to BL1n. The sources and drains of the n-type MOS transistors 152 are connected to the latch circuits 150 and the bit lines BL11 to BL1n. Whether or not the respective bit lines BL11 to BL1n are connected to the latch circuits 150 switches in accordance with a signal LAT which is supplied to the gates of the n-type MOS transistors 152.

The data bus 160 transfers data to be stored at the memory cells MC, which are supplied from outside. The sources and drains of the n-type MOS transistors 162 are connected to the data bus 160 and the bit lines BL21 to BL2n. Whether or not the bit lines BL21 to BL2n are connected with the data bus 160 switches in accordance with voltages of signals YSEL which are supplied to the gates of the n-type MOS transistors 162.

Next, operations of the display-driving IC of the present embodiment will be described. Hereinbelow, first, an operation for writing a datum to the memory cell MC that is connected to the word line WL11, the plate line PL11 and the bit line BL11 (below referred to as "the object memory cell MC") will be described, and then an operation for reading the datum stored at the object memory cell MC and driving the display with the display-driving circuit 170 will be described.

First, when a datum provided to the data bus 160 is to be stored to the object memory cell MC, the n-type MOS transistor 162 connects the bit line BL21 to the data bus 160 in accordance with the signal YSEL. Then, when the sense amplifier 140 that is connected to the bit line BL21 turns on, a voltage of the bit line BL11 connected to the object memory cell MC becomes substantially the same as a voltage of the data bus 160. In the present embodiment, when a data '1' is to be stored to a ferroelectric capacitor C, a driving voltage VCC of the display-driving IC is supplied to the data bus 160, and when a data '0' is to be stored, 0 V is supplied to the data bus 160. Then, when the word line control section 120 alters a voltage of the word line WL11 to turn on the n-type MOS transistor TR of the object memory cell MC, the voltage of the bit line BL11 is supplied to the one terminal of the ferroelectric capacitor C, and the predetermined datum is stored at the object ferroelectric capacitor C in accordance with the voltage of the data bus 160.

Subsequently, when the datum stored at the object memory cell MC is to be read, first, the word line control section 120 turns on the word line WL11 and the dummy word line DWL2. Hence, when the plate line control section 130 raises a voltage of the plate line PL11 to VCC, charge that has been stored at the object ferroelectric capacitor C is released to the bit line BL11. At this time, a voltage of the bit line BL11 rises higher if a data '1' has been stored at the object memory cell than if a data '0' has been stored there at.

Further, when the datum stored at the object memory cell MC is read out, the word line control section 120 alters a voltage of the dummy word line DWL2 to turn on the n-type MOS transistor TR of the dummy cell DMC2. The plate line control section 130 sets a voltage of the dummy plate line DPL2 to VCC, and a charge that has been stored at the ferroelectric capacitor C of the dummy cell DMC2 is released to the bit line BL21.

In the present embodiment, a data '1' is stored at the dummy cell DMC2. The n-type MOS transistor 162 connected to the bit line BL21 is turned on and connects the bit line BL21 to the data bus 160. Accordingly, a quantity of charge corresponding to data '1' is released to the bit line BL21. However, the n-type MOS transistor 162 is turned on, and a capacitance applied to the bit line BL21 is larger than for the bit line BL11. Therefore, the voltage of the bit line BL21 rises to a voltage between a voltage of the bit line BL11 in a case in which a data '1' has been stored at the object memory cell MC and a voltage of the bit line BL11 in a case in which a data '0' has been stored there at. Thus, if a data '1' has been stored at the object memory cell MC, the voltage of the bit line BL11 will be higher than the voltage of the bit line BL21, whereas if a data '0' has been stored there at, the voltage of the bit line BL11 will be lower than the voltage of the bit line BL21.

Then, after the charges have been released to the bit lines BL11 and BL21, the sense amplifier 140 amplifies the voltage of the bit line BL11 on the basis of the voltage of the bit line BL21, which is to say, amplifies the datum stored at the object memory cell MC. More specifically, if the voltage of the bit line BL11 is higher than the voltage of the bit line BL21, that is, if a data '1' had been stored at the object memory cell MC, the sense amplifier 140 raises the voltage of the bit line BL11 to VCC. On the other hand, if the voltage of the bit line BL11 is lower than the voltage of the bit line BL21, that is, if a data '0' had been stored at the object memory cell MC, the sense amplifier 140 sets the voltage of the bit line BL11 to 0 V.

Next, the n-type MOS transistor 152 turns on and the latch circuit 150 latches the datum that has been read from the object memory cell MC to the bit line BL11. Hence, the display-driving circuit 170 drives the external display device on the basis of data latched to the latch circuits 150. With the above operations, it is possible to drive the external display device on the basis of data stored from outside.

In the above example, operations of the display-driving IC have been described for an example of a memory cell MC of the memory cell array 110. The display-driving IC may be similarly operated in a case of storing data and reading data at a memory cell MC of the memory cell array 112. However, when a datum is to be read from a memory cell MC of the memory cell array 112, the sense amplifier 140 amplifies the datum read from this object memory cell MC by reference to the dummy memory cell DMC1 of the memory cell array 110. At such times, it is preferable if the n-type MOS transistors 152 are turned on, to apply predetermined capacitances to the bit lines BL11 to BL1$n$.

Furthermore, in the above example, reference voltages are generated by turning on the n-type MOS transistors 152 and 162 to apply predetermined capacitances to the bit lines BL. However, it is also possible to make areas of the dummy memory cells DMC1 and DMC2 different from the areas of the memory cells MC, and generate the reference voltages thus.

In the present embodiment, the bit lines BL11 to BL1$n$ and bit lines BL21 to BL2$n$ connected to the sense amplifiers 140 extend in substantially opposite directions to one another. Therefore, according to the present embodiment, a distribution spacing of the memory cells MC of the memory cell arrays 110 and 112 in a direction of extension of the bit lines can be tightened, and thus it is possible to provide a ferroelectric memory device with a higher level of integration. In particular, in a case in which this ferroelectric memory device is employed at a display-driving IC as in the present embodiment, the spacing of the bit lines BL can be made to correspond to a spacing of the external display device, and the size of the display-driving IC in the direction of extension of the bit lines BL can be reduced. In other words, it is possible to provide a ferroelectric memory device and display-driving IC with extremely high area efficiency.

In the present embodiment, in comparison with a folded-bit line architecture, lengths of the bit lines BL can be substantially halved. Therefore, capacitances of the bit lines BL can be lowered, and potential differences between the bit lines connected to the sense amplifiers 140 can be made larger. As a result, it is possible to provide a ferroelectric memory device and display-driving IC which operate at high speed with low power consumption.

In the present embodiment, because the dummy cells DMC are connected to, respectively, the bit lines BL11 to BL1$n$ and the bit lines BL21 to BL2$n$, there is no need to include a separate bit line for referencing. Therefore, according to the present embodiment, even in a case of the ferroelectric memory device being used at a device whose size in a word line direction is fixed, such as the display-driving IC or the like, spacings of the bit lines BL can be satisfactorily assigned.

According to the present embodiment, it is possible to suitably control the n-type MOS transistors 152 and 162 to turn on and off, and control capacitances that are applied to the respective bit lines BL. Thus, it is possible to provide a ferroelectric memory device with large reading margins.

SECOND EMBODIMENT

Figure 2:
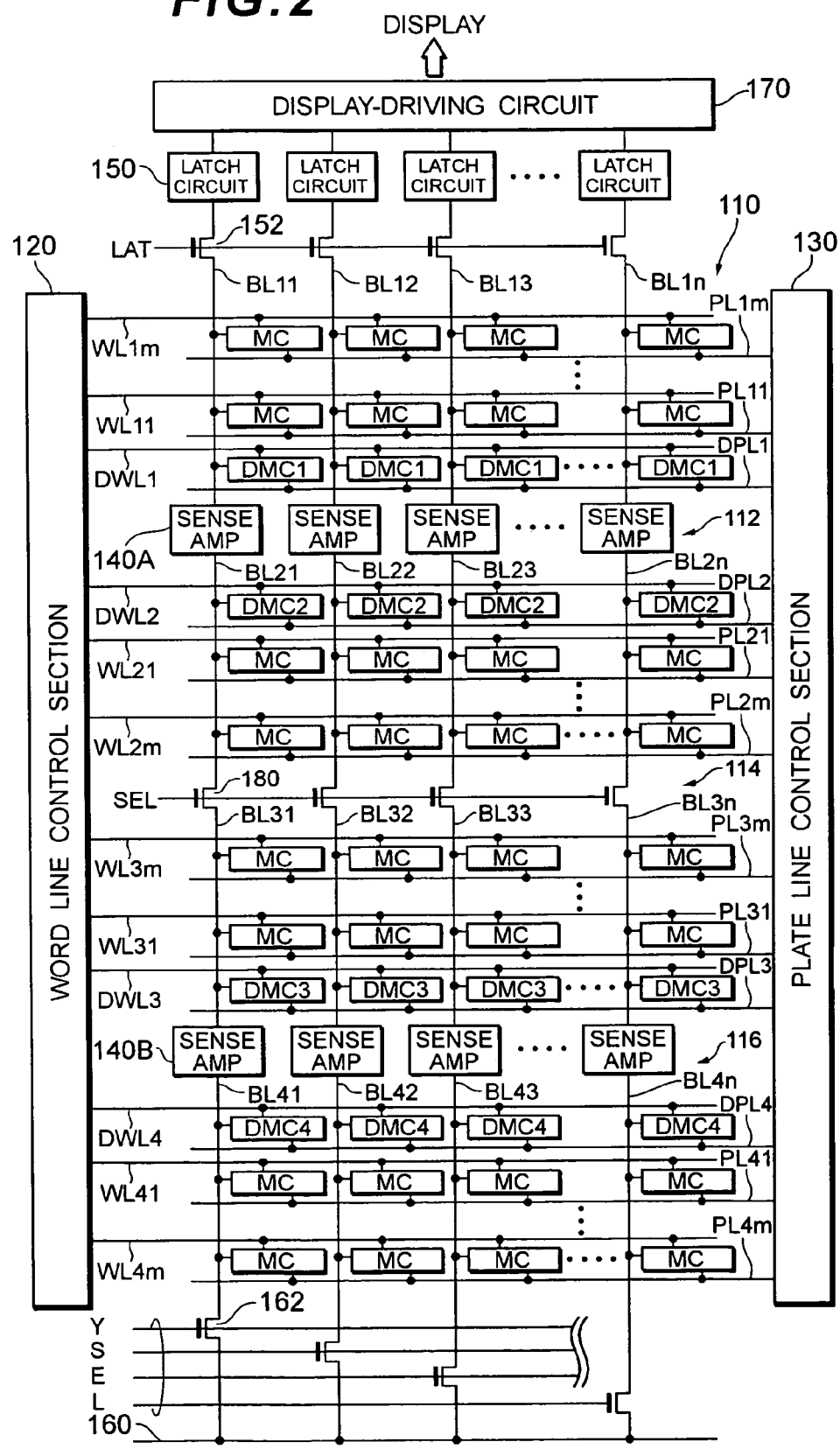
FIG. 2 is a diagram showing structure of a display-driving IC relating to a second embodiment of the invention.

FIG. 2 is a diagram showing structure of a display-driving IC relating to a second embodiment of the invention. Because structures and operations of the present embodiment duplicate those of the above-described first embodiment, only points that differ will be described here below.

The ferroelectric memory device is a structure which includes: the memory cell arrays 110 and 112 and memory cell arrays 114 and 116; the word line control section 120; the plate line control section 130; sense amplifiers 140A and 140B; the latch circuits 150; the n-type MOS transistors 152, which are examples of the second switch; the data bus 160; the n-type MOS transistors 162, which are examples of the first switch; pluralities of bit lines BL11 to BL1$n$, BL21 to BL2$n$, BL31 to BL3$n$ and BL41 to BL4$n$ ($n$ being an integer of at least two; these are below referred to as bit lines BL); pluralities of word lines WL11 to WL1$m$, WL21 to WL2$m$, WL31 to WL3$m$ and WL41 to WL4$m$ ($m$ being an integer of at least two; these are below referred to as word lines WL); pluralities of plate lines PL11 to PL1$m$, PL21 to PL2$m$, PL31 to PL3$m$ and PL41 to PL4$m$ (below referred to as plate lines PL), dummy word lines DWL1 to DWL4 and dummy plate lines DPL1 to DPL4; and switches for switching whether or not the bit lines BL21 to BL2$n$ are connected with the bit lines BL31 to BL3$n$ (as an example, n-type MOS transistors 180).

Pluralities of memory cells MC are formed at the respective memory cell arrays 110 to 116, and the pluralities of memory cells MC are connected to the respective bit lines BL. Further, dummy cells DMC1, DMC 2, DMC3 and DMC4 are provided at the memory cell arrays 110 to 116, respectively. More specifically, the dummy cells DMC1 to DMC4, respectively, are connected to the bit lines BL, the dummy word lines DWL1 to DWL4 and the dummy plate lines DPL1 to DPL4. The dummy cells DMC may have structures the same as the memory cells MC, and may have structures different from the memory cells MC. Furthermore, in the memory cell arrays 110 to 116, the dummy cells DMC are disposed, for example, between regions at which the memory cells MC are disposed and the sense amplifiers 140A and 140B. That is, in the memory cell arrays 110 to 116, the dummy cells DMC1 to DMC4 are connected to the bit lines BL at positions which are closer to the sense amplifiers 140A and 140B than the memory cells MC.

The sense amplifiers 140A and 140B have the same circuit structures as one another, and more specifically are latch-type sense amplifiers each including one terminal and another terminal. The bit lines BL11 to BL1$n$ are connected to the one terminals of the sense amplifiers 140A and the bit lines BL21 to BL2$n$ are connected to the other terminals thereof. The bit lines BL31 to BL3$n$ are connected to the one terminals of the sense amplifiers 140B and the bit lines BL41 to BL4$n$ are connected to the other terminals thereof. The bit lines BL11 to BL1$n$ and BL31 to BL3$n$ extend in the first direction, from the sense amplifiers 140A and 140B towards the latch circuits 150, and the bit lines BL21 to BL2$n$ and BL41 to BL4$n$ extend in the second direction, which is a direction substantially opposite to the first direction.

When data stored at the memory cells MC of the memory cell array 110 are being read, the sense amplifiers 140A amplify the data stored at those memory cells MC in accordance with charges released from data of the dummy cells DMC2 of the memory cell array 112, and when data stored at the memory cells MC of the memory cell array 112 are being read, the sense amplifiers 140A amplify the data stored at those memory cells MC in accordance with charges released from data of the dummy cells DMC1 of the memory cell array 110. Further, when data stored at the memory cells MC of the memory cell array 114 are being read, the sense amplifiers 140B amplify the data stored at those memory cells MC in accordance with charges released from data of the dummy cells DMC4 of the memory cell array 116, and when data stored at the memory cells MC of the memory cell array 116 are being read, the sense amplifiers 140B amplify the data stored at those memory cells MC in accordance with charges released from data of the dummy cells DMC3 of the memory cell array 114. In other words, the ferroelectric memory device of the present embodiment has an open bit line architecture, and has a structure in which at least two of the sense amplifiers (two in the example shown in FIG. 2, but three or more is also possible) are serially provided along the direction of the bit lines.

The latch circuits 150 latch the data that have been amplified by the sense amplifiers 140A and 140B. The n-type MOS transistors 152 are disposed between the latch circuits 150 and the bit lines BL11 to BL1n. The sources and drains of the n-type MOS transistors 152 are connected to the latch circuits 150 and the bit lines BL11 to BL1n. Whether or not the respective bit lines BL11 to BL1n are connected to the latch circuits 150 switches in accordance with a signal LAT which is supplied to the gates of the n-type MOS transistors 152.

The data bus 160 transfers data which are to be stored at the memory cells MC. The n-type MOS transistors 162 are provided between the data bus 160 and the bit lines BL41 to BL4n. The sources and drains of the n-type MOS transistors 162 are connected to the data bus 160 and the bit lines BL41 to BL4n. Whether or not the bit lines BL41 to BL4n are connected with the data bus 160 switches in accordance with signals YSEL which are supplied to the gates of the n-type MOS transistors 162.

The n-type MOS transistors 180 are provided between the bit lines BL21 to BL2n and the bit lines BL31 to BL3n. The sources and drains of the n-type MOS transistors 180 are connected to the bit lines BL21 to BL2n and the bit lines BL31 to BL3n. Whether or not the bit lines BL21 to BL2n are connected with the bit lines BL31 to BL3n switches in accordance with a signal SEL which is supplied to the gates of the n-type MOS transistors 180.

Next, operations of the display-driving IC of the present embodiment will be described. Hereinbelow, first, an operation for writing a datum to the memory cell MC that is connected to the word line WL11, the plate line PL11 and the bit line BL11 (below referred to as "the object memory cell MC") will be described, and then an operation for reading the datum stored at the object memory cell MC and driving the display with the display-driving circuit 170 will be described.

First, when a datum provided to the data bus 160 is to be stored to the object memory cell MC, the n-type MOS transistor 162 connects the bit line BL41 to the data bus 160 in accordance with the signal YSEL. Then, when each of the sense amplifier 140B, the n-type MOS transistor 180 and the sense amplifier 140A turns on, a voltage of the bit line BL11 connected to the object memory cell MC becomes substantially the same as a voltage of the data bus 160. Then, when the word line control section 120 alters a voltage of the word line WL11, the predetermined datum is stored at the object memory cell MC in accordance with the voltage of the data bus 160 (for example, VCC or 0 V).

Here, the sense amplifiers 140A and 140B and the n-type MOS transistors 180 can be suitably turned on and off for each memory cell MC to be accessed, in accordance with the position thereof in the memory cell arrays.

Subsequently, when the datum stored at the object memory cell MC is to be read, first, the word line control section 120 turns on the word line WL11 and the dummy word line DWL2. Hence, when the plate line control section 130 raises a voltage of the plate line PL11 to VCC, charge that has been stored at the ferroelectric capacitor of the object memory cell MC is released to the bit line BL11. At this time, a voltage of the bit line BL11 rises higher if a data '1' has been stored at the object memory cell MC than if a data '0' has been stored there at.

Further, when the datum stored at the object memory cell MC is read out, the word line control section 120 alters a voltage of the dummy word line DWL2, and the plate line control section 130 sets a voltage of the dummy plate line DPL2 to VCC. Thus, a charge that has been stored at the ferroelectric capacitor of the dummy cell DMC2 is released to the bit line BL21.

If, for example, the dummy cell DMC2 has a different structure from the memory cell MC, then if, for example, a capacitor area of the dummy cell DMC2 is larger than a capacitor area of the memory cell MC, a data '0' is stored at the dummy cell DMC2, whereas if the capacitor area of the dummy cell DMC2 is smaller than the capacitor area of the memory cell MC, a data '1' is stored at the dummy cell DMC2. Accordingly, a voltage which is between a voltage of the bit line BL11 in a case in which a data '1' has been stored at the object memory cell MC and a voltage of the bit line BL11 in a case in which a data '0' has been stored there at is expressed at the bit line BL21. Thus, if a data '1' has been stored at the object memory cell MC, the voltage of the bit line BL11 will be higher than the voltage of the bit line BL21, whereas if a data '0' has been stored there at, the voltage of the bit line BL11 will be lower than the voltage of the bit line BL21. Thus, a reference voltage is generated on the basis of the datum stored at the dummy cell DMC2, and it is possible to read out the datum of the object memory cell MC.

Then, after the charges have been released to the bit lines BL11 and BL21, the sense amplifier 140A amplifies the voltage of the bit line BL11 on the basis of the voltage of the bit line BL21, which is to say, amplifies the datum stored at the object memory cell MC. More specifically, if the voltage of the bit line BL11 is higher than the voltage of the bit line BL21, that is, if a data '1' had been stored at the object memory cell MC, the sense amplifier 140A raises the voltage of the bit line BL11 to VCC. On the other hand, if the voltage of the bit line BL11 is lower than the voltage of the bit line BL21, that is, if a data '0' had been stored at the object memory cell MC, the sense amplifier 140 sets the voltage of the bit line BL11 to 0 V.

Next, the n-type MOS transistor 152 turns on and the latch circuit 150 latches the datum that has been read from the object memory cell MC to the bit line BL11. Hence, the display-driving circuit 170 drives the external display device on the basis of data latched to the latch circuits 150. With the above operations, it is possible to drive the external display device on the basis of data stored from outside.

In the above description, a case in which the dummy cell DMC2 has a structure which differs from the memory cell MC is described. However, it is also possible to perform the reading operation in a case in which the dummy cell DMC2 has a structure the same as the memory cell MC, that is, a case in which capacitor areas of the two are the same. That is, it is possible to generate a reference voltage based on the datum stored at the dummy cell DMC2 by altering a capacitance that is applied to the bit line BL21. For example, if a data '1' is stored at the dummy cell DMC2, the n-type MOS transistor 180 is turned on in accordance with the signal SEL and the bit line BL21 is connected with the bit line BL31. In such a case, although an amount of charge corresponding to a data '1' is released to the bit line BL21, because the capacitance applied to the bit line BL21 is larger than that for the bit line BL11, a voltage which is between a voltage of the bit line BL11 when a data '1' has been stored at the object memory cell MC and a voltage of the bit line BL11 when a data '0' has been stored there at is expressed at the bit line BL21. Further, in such a case, the sense amplifier 140B may be turned on along with the n-type MOS transistor 180 and the bit line BL21 further connected with the bit line BL41, and the n-type MOS transistor 162 may be turned on along with the n-type MOS transistor 180 and the sense amplifier 140B, to further connect the bit line BL21 with the data bus 160.

Alternatively, as another example, in a case in which the dummy cell DMC2 has a structure the same as the memory cell MC, that is, a case in which capacitor areas of the two are the same, it is possible to alter a capacitance applied to the bit line BL11 at the object memory cell MC side. For example, if a data '0' is stored at the dummy cell DMC2, the n-type MOS transistor 152 is turned on in accordance with the signal LAT and the bit line BL11 is connected with the latch circuit 150. In such a case, although an amount of charge corresponding to the either data '0' or '1' that was stored at the memory cell MC is released to the bit line BL11, because the capacitance applied to the bit line BL11 is larger than that for the bit line BL21, a voltage of the bit line BL21 is relatively set to between a voltage of the bit line BL11 when a data '1' has been stored at the object memory cell MC and a voltage of the bit line BL11 when a data '0' has been stored there at.

Further, data that is read out from any memory cell MC connected to the bit line BL31 may be amplified by the sense amplifier 140B with reference to a dummy cell DMC4 connected to the bit line BL41. In such a case, the dummy cell DMC4 may have a structure the same as the memory cell MC, and may have a structure different from the memory cell MC. In the latter case, a data '0' may be stored at the dummy cell DMC4 and a capacitance applied to the bit line BL31 may be altered. More specifically, the n-type MOS transistor 180 may be turned on in accordance with the signal SEL and the bit line BL31 connected with the bit line BL21, or the sense amplifier 140A may be turned on along with the n-type MOS transistor 180 and the bit line BL31 further connected with the bit line BL11, or the n-type MOS transistor 152 may be turned on along with the n-type MOS transistor 180 and the sense amplifier 140A, to further connect the bit line BL31 with the latch circuit 150.

Further, the sense amplifiers 140A may amplify data that has been stored in the memory cell array 112 by reference to the dummy cells DMC1, and the sense amplifiers 140B may amplify data that has been stored in the memory cell array 116 by reference to the dummy cells DMC3.

As described here above, in the present embodiment, the bit lines BL11 to BL1$n$ and the bit lines BL21 to BL2$n$ connected to the sense amplifiers 140A, and the bit lines BL31 to BL3$n$ and the bit lines BL41 to BL4$n$ connected to the sense amplifiers 140B, respectively extend in substantially opposite directions to one another. Therefore, according to the present embodiment, a distribution spacing of the memory cells MC of the memory cell arrays 110 to 116 in a direction of extension of the bit lines BL can be tightened, and thus it is possible to provide a ferroelectric memory device with a higher level of integration. In particular, in a case in which this ferroelectric memory device is employed at a display-driving IC as in the present embodiment, the spacing of the bit lines BL can be made to correspond to a spacing of the external display device, and the size of the display-driving IC in the direction of extension of the bit lines BL can be reduced. In other words, it is possible to provide a ferroelectric memory device and display-driving IC with extremely high area efficiency.

Note that details of other structures and effects of the present embodiment are as described for the first embodiment.

THIRD EMBODIMENT

Figure 3:
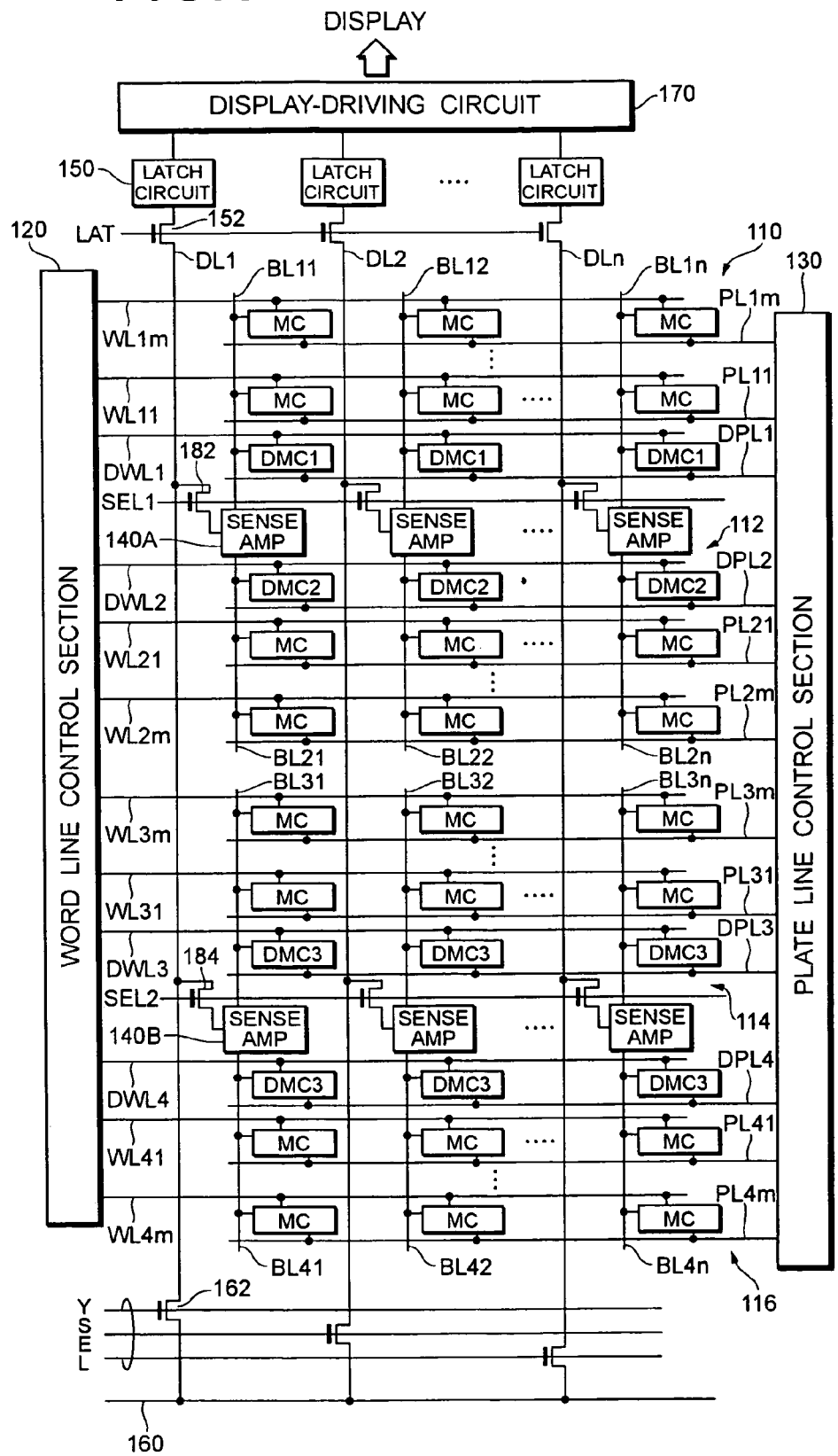
FIG. 3 is a diagram showing structure of a display-driving IC relating to a third embodiment of the invention.

FIG. 3 is a diagram showing structure of a display-driving IC relating to a third embodiment of the invention. Because structures and operations of the present embodiment duplicate those of the above-described second embodiment, only points that differ will be described here below.

The ferroelectric memory device is a structure which includes: the memory cell arrays 110, 112, 114 and 116; the word line control section 120; the plate line control section 130; the sense amplifiers 140A and 140B; the latch circuits 150; the n-type MOS transistors 152, which are examples of the second switch; the data bus 160; the n-type MOS transistors 162, which are examples of the first switch; pluralities of bit lines BL11 to BL1$n$, BL21 to BL2$n$, BL31 to BL3$n$ and BL41 to BL4$n$ ($n$ being an integer of at least two; these are below referred to as bit lines BL); pluralities of word lines WL11 to WL1$m$, WL21 to WL2$m$, WL31 to WL3$m$ and WL41 to WL4$m$ ($m$ being an integer of at least two; these are below referred to as word lines WL); pluralities of plate lines PL11 to PL1$m$, PL21 to PL2$m$, PL31 to PL3$m$ and PL41 to PL4$m$ (below referred to as plate lines PL); dummy word lines DWL1 to DWL4 and dummy plate lines DPL1 to DPL4; data lines DL1 to DL$n$ (below referred to as data lines DL); and switches for switching whether or not the data lines DL1 to DL$n$ are connected with the sense amplifiers 140A and 140B (for example, n-type MOS transistors 182 and 184).

In the above-described second embodiment, the bit lines BL serve for both transfers of writing data from the data bus 160 and transfers of reading data to the latch circuits 150. In the present embodiment however, the data lines DL are separately provided for transferring these data.

The data lines DL extend in the first direction from one ends to other ends thereof. The data bus 160 is connected to the one ends via the n-type MOS transistors 162, and the latch circuits 150 are connected to the other ends via the n-type MOS transistors 152. Further, between each n-type MOS transistor 152 and n-type MOS transistor 162, the respective data line DL1 to DL$n$ is connected with the sense amplifier 140A via the n-type MOS transistor 182, which is operated in accordance with a signal SEL1, and is connected with the sense amplifier 140B via the n-type MOS transistor 184, which is operated in accordance with a signal SEL2. More specifically, the source and drain of the n-type MOS transistor 182 are connected to the data line DL and the sense amplifier 140A, and whether or not the data line DL is connected with the sense amplifier 140A switches in accordance with the signal SEL1, which is supplied to the gates of the n-type MOS transistors 182. Further, the source and drain of the n-type MOS transistor 184 are connected to the data line DL and the sense amplifier 140B, and whether or not the data line DL is connected with the sense amplifier 140B switches in accordance with the signal SEL2, which is supplied to the gates of the n-type MOS transistors 184.

Next, operations of the display-driving IC of the present embodiment will be described. Hereinbelow, first, an operation for writing a datum to the memory cell MC that is connected to the word line WL11, the plate line PL11 and the bit line BL11 (below referred to as "the object memory cell MC") will be described, and then an operation for reading the datum stored at the object memory cell MC and driving the display with the display-driving circuit 170 will be described.

First, when a datum provided to the data bus 160 is to be stored to the object memory cell MC, the n-type MOS transistor 162 connects the data line DL1 to the data bus 160 in accordance with the signal YSEL. Then, when each of the n-type MOS transistor 182 and the sense amplifier 140A turns on, a voltage of the bit line BL11 connected to the object memory cell MC becomes substantially the same as a voltage of the data bus 160. Then, when the word line control section 120 alters a voltage of the word line WL11, the predetermined datum is stored at the object memory cell MC in accordance with the voltage of the data bus 160 (for example, VCC or 0 V).

Here, the sense amplifiers 140A and 140B and the n-type MOS transistors 182 and 184 can be suitably turned on and off for each memory cell MC to be accessed, in accordance with the position thereof in the memory cell arrays.

Subsequently, when the datum stored at the object memory cell MC is to be read, first, the word line control section 120 turns on the word line WL11 and the dummy word line DWL2. Hence, when the plate line control section 130 raises a voltage of the plate line PL11 to VCC, charge that has been stored at the ferroelectric capacitor of the object memory cell MC is released to the bit line BL11. At this time, a voltage of the bit line BL11 rises higher if a data '1' has been stored at the object memory cell MC than if a data '0' has been stored there at.

Further, when the datum stored at the object memory cell MC is read out, the word line control section 120 alters a voltage of the dummy word line DWL2, and the plate line control section 130 sets a voltage of the dummy plate line DPL2 to VCC. Thus, a charge that has been stored at the ferroelectric capacitor of the dummy cell DMC2 is released to the bit line BL21.

Then, after the charges have been released to the bit lines BL11 and BL21, the sense amplifier 140A amplifies the voltage of the bit line BL11 on the basis of the voltage of the bit line BL21, which is to say, amplifies the datum stored at the object memory cell MC. More specifically, if the voltage of the bit line BL11 is higher than the voltage of the bit line BL21, that is, if a data '1' had been stored at the object memory cell MC, the sense amplifier 140A raises the voltage of the bit line BL11 to VCC. On the other hand, if the voltage of the bit line BL11 is lower than the voltage of the bit line BL21, that is, if a data '0' had been stored at the object memory cell MC, the sense amplifier 140 sets the voltage of the bit line BL11 to 0 V.

Here, generation of a reference voltage in accordance with a datum stored at the dummy cell DMC2 is as described for the second embodiment. More specifically, if a capacitor area of the dummy cell DMC2 is larger than a capacitor area of the memory cell MC, a data '0' may be stored at the dummy cell DMC2, whereas if the capacitor area of the dummy cell DMC2 is smaller than the capacitor area of the memory cell MC, a data '1' may be stored at the dummy cell DMC2.

Thereafter, the n-type MOS transistors 182 and 152 turn on and the latch circuit 150 latches the datum that has been read from the object memory cell MC to the bit line BL11. Hence, the display-driving circuit 170 drives the external display device on the basis of data latched to the latch circuits 150. With the above operations, it is possible to drive the external display device on the basis of data stored from outside.

In the above example, operations of the display-driving IC have been described for an example of a memory cell MC of the memory cell array 110, and the display-driving IC may be similarly operated in a case of storing data and reading data at a memory cell MC of the other memory cell arrays. For example, the sense amplifiers 140A may amplify data stored in the memory cell array 112 by reference to the dummy cells DMC1, the sense amplifiers 140B may amplify data stored in the memory cell array 116 by reference to the dummy cells DMC3, and the sense amplifiers 140B may amplify data stored in the memory cell array 114 by reference to the dummy cells DMC4.

As described here above, in the present embodiment, the bit lines BL connected to the sense amplifiers 140A and 140B respectively extend in substantially opposite directions to one another. Therefore, according to the present embodiment, a distribution spacing of the memory cells MC of the memory cell arrays 110 to 116 in a direction of extension of the bit lines BL can be tightened, and thus it is possible to provide a ferroelectric memory device with a higher level of integration. In particular, in a case in which this ferroelectric memory device is employed at a display-driving IC as in the present embodiment, the spacing of the bit lines BL can be made to correspond to a spacing of the external display device, and the size of the display-driving IC in the direction of extension of the bit lines BL can be reduced. In other words, it is possible to provide a ferroelectric memory device and display-driving IC with extremely high area efficiency.

Note that details of other structures and effects of the present embodiment are as described for the first and second embodiments.

FOURTH EMBODIMENT

Figure 4:
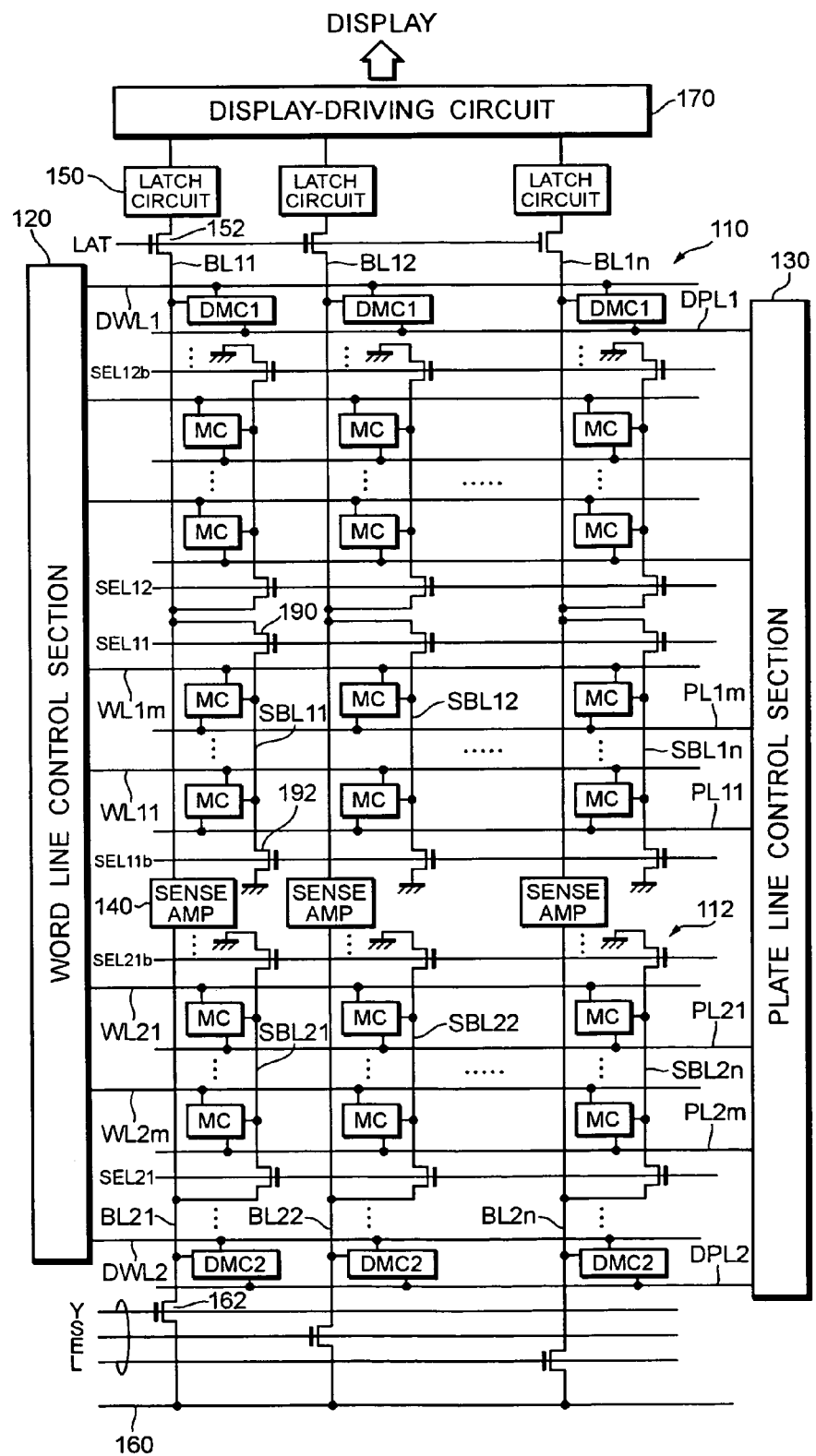
FIG. 4 is a diagram showing structure of a display-driving IC relating to a fourth embodiment of the invention.

FIG. 4 is a diagram showing structure of a display-driving IC relating to a fourth embodiment of the invention. Because structures and operations of the present embodiment duplicate those of the above-described first embodiment, only points that differ will be described here below.

The ferroelectric memory device is a structure which includes: the memory cell arrays 110 and 112; the word line control section 120; the plate line control section 130; the sense amplifiers 140; the latch circuits 150; the n-type MOS transistors 152, which are examples of the second switch; the data bus 160; the n-type MOS transistors 162, which are examples of the first switch; pluralities of bit lines BL11 to BL1$n$ and BL21 to BL2$n$ ($n$ being an integer of at least two; these are below referred to as bit lines BL); pluralities of sub-bit lines SBL11 to SBL1$n$ and SBL21 to SBL2$n$ (these are below referred to as sub-bit lines SBL); pluralities of word lines WL11 to WL1$m$ and WL21 to WL2$m$ ($m$ being an integer of at least two; these are below referred to as word lines WL); pluralities of plate lines PL11 to PL1$m$ and PL21 to PL2$m$ (below referred to as plate lines PL); dummy word lines DWL1 and DWL2; and dummy plate lines DPL1 and DPL2.

In the present embodiment, a plurality of the sub-bit lines SBL is connected to each bit line BL, and a "hierarchical bit line architecture" is employed. The pluralities of memory cells MC of the respective memory cell arrays 110 and 112 are connected to the sub-bit lines SBL. More specifically, one of the source and drain of the n-type MOS transistor of each memory cell MC is connected to a sub-bit line SBL, and the other is connected to one terminal of the ferroelectric capacitor. The gate of the n-type MOS transistor of the memory cell MC is connected to a word line WL. Thus, whether or not the one terminal of the ferroelectric capacitor is connected to the corresponding sub-bit line SBL switches in accordance with potential of that word line WL.

The other terminal of the ferroelectric capacitor is connected to a plate line PL. Thus, the ferroelectric capacitor stores a predetermined datum in accordance with a potential difference between the corresponding sub-bit line SBL and plate line PL, that is, a potential difference between the one terminal and the other terminal of the ferroelectric capacitor.

Voltages of the respective sub-bit lines SBL are controlled in accordance with signals SEL11, SEL11b, etc. For example, one end of the sub-bit line SBL11 is connected with the bit line BL11 via a switch (for example, an n-type MOS transistor 190), and the other end of the sub-bit line SBL11 is connected to ground via another switch (for example, an n-type MOS transistor 192). More specifically, one of the source and drain of the n-type MOS transistor 190 is connected to the bit line BL11 and the other is connected to the sub-bit line SBL11, and the gate is connected to the signal SEL11. Further, one of the source and drain of the n-type MOS transistor 192 is connected to ground and the other is connected to the sub-bit line SBL11, and the gate is connected to the signal SEL11b.

In the memory cell arrays 110 and 112, dummy cells DMC1 and DMC2 are provided. Specifically, the dummy cells DMC1 are connected to the bit lines BL11 to BL1n, and the dummy cells DMC2 are connected to the bit lines BL21 to BL2n. The dummy cells DMC may have structures the same as the memory cells MC, and may have structures which differ from the memory cells MC.

Anyway, apart from the sub-bit lines SBL being provided and the pluralities of memory cells MC being connected to the corresponding sub-bit lines SBL, the present embodiment is otherwise as described for the first embodiment.

Next, operations of the display-driving IC of the present embodiment will be described. Hereinbelow, first, an operation for writing a datum to the memory cell MC that is connected to the word line WL11, the plate line PL11 and the sub-bit line SBL11 (below referred to as "the object memory cell MC") will be described, and then an operation for reading the datum stored at the object memory cell MC and driving the display with the display-driving circuit 170 will be described.

First, when a datum provided to the data bus 160 is to be stored to the object memory cell MC, the n-type MOS transistor 162 connects the bit line BL21 to the data bus 160 in accordance with the signal YSEL. Then, when both the sense amplifier 140 and the n-type MOS transistor 190 turn on, a voltage of the sub-bit line SBL11 connected to the object memory cell MC becomes substantially the same as a voltage of the data bus 160. Then, when the word line control section 120 alters a voltage of the word line WL11, the predetermined datum is stored at the object memory cell MC in accordance with the voltage of the data bus 160 (for example, VCC or 0 V).

Subsequently, when the datum stored at the object memory cell MC is to be read, first, the word line control section 120 turns on the word line WL11 and the dummy word line DWL2. Hence, when the plate line control section 130 raises a voltage of the plate line PL11 to VCC, charge that has been stored at the ferroelectric capacitor of the object memory cell MC is released to the sub-bit line SBL11, and when the n-type MOS transistor 190 is turned on, the object charge is further released to the bit line BL11. At this time, voltages of the sub-bit line SBL11 and the bit line BL11 rise higher if a data '1' has been stored at the object memory cell than if a data '0' has been stored there at.

At a memory cell MC which is not being accessed, the n-type MOS transistor, of which one of the source and the drain is grounded, is turned on. Thus, the sub-bit line SBL connected to the memory cell MC that is not being accessed is connected to ground, and the plate line PL supplies 0 V to the other side of the memory cell MC. As a result, both the one terminal and the other terminal of the ferroelectric capacitor of the memory cell MC that is not being accessed are at ground potential, and no electric field is applied therebetween. Therefore, the datum that has been stored at that ferroelectric capacitor will be preserved without being disrupted.

Further, when the datum stored at the object memory cell MC is read out, the word line control section 120 alters a voltage of the dummy word line DWL2. In addition, the plate line control section 130 sets a voltage of the dummy plate line DPL2 to VCC. Accordingly, a charge that has been stored at the ferroelectric capacitor of the dummy cell DMC2 is released to the bit line BL21.

Herein, a mode by which the dummy cell DMC is set to a reference voltage is as described for the first and second embodiments.

Then, after the charges have been released to the bit lines BL11 and BL21, the sense amplifier 140 amplifies the voltage of the bit line BL11 on the basis of the voltage of the bit line BL21, which is to say, amplifies the datum stored at the object memory cell MC. More specifically, if the voltage of the bit line BL11 is higher than the voltage of the bit line BL21, that is, if a data '1' had been stored at the object memory cell MC, the sense amplifier 140 raises the voltage of the bit line BL11 to VCC. On the other hand, if the voltage of the bit line BL11 is lower than the voltage of the bit line BL21, that is, if a data '0' had been stored at the object memory cell MC, the sense amplifier 140 sets the voltage of the bit line BL11 to 0 V.

Next, the n-type MOS transistor 152 turns on and the latch circuit 150 latches the data that has been read from the object memory cell MC to the bit line BL11. Hence, the display-driving circuit 170 drives the external display device on the basis of data latched to the latch circuits 150. With the above operations, it is possible to drive the external display device on the basis of data stored from outside.

In the above example, operations of the display-driving IC have been described for an example of a memory cell MC of the memory cell array 110. The display-driving IC may be similarly operated in a case of storing data and reading data at a memory cell MC of the memory cell array 112. When a datum is to be read from a memory cell MC of the memory cell array 112, the sense amplifier 140 amplifies the datum read from this object memory cell MC by reference to a dummy memory cell DMC1 of the memory cell array 110.

In the present embodiment, the bit lines BL11 to BL1n and the bit lines BL21 to BL2n connected to the sense amplifiers 140 extend in substantially opposite directions to one another. Therefore, according to the present embodiment, a distribution spacing of the memory cells MC of the memory cell arrays 110 and 112 in a direction of extension of the bit lines BL can be tightened, and thus it is possible to provide a ferroelectric memory device with a higher level of integration. In particular, in a case in which this ferroelectric memory device is employed at a display-driving IC as in the present embodiment, the spacing of the bit lines BL can be made to correspond to a spacing of the external display device, and the size of the display-driving IC in the direction of extension of the bit lines BL can be reduced. In other words, it is possible to provide a ferroelectric memory device and display-driving IC with extremely high area efficiency. Furthermore, because a plurality of sub-bit lines SBL is connected to each bit line BL, capacitances that are applied to the bit lines BL can be lowered. Therefore, it is further possible to provide a ferroelectric memory device which operates at high speed with large reading margins.

Note that details of other structures and effects of the present embodiment are as described for the first, second and third embodiments.

The embodiment examples and application examples that have been described by the above embodiments of the invention can be suitably combined in accordance with objectives and/or employed with variations and/or modifications having been applied. The invention is not limited to the above recitations of the embodiments. That such combinations and modes in which variations and modifications are applied are to be included within the technical scope of the invention is clear from the recitations of the attached claims.

What is claimed is:

1. A ferroelectric memory device comprising:
    a first bit line which extends, from one end toward another end thereof, in a first direction;
    a plurality of first memory cells, which are connected to the first bit line and store predetermined data;
    a second bit line which extends, from one end toward another end thereof, in a second direction, which is a direction substantially opposite to the first direction;
    a plurality of second memory cells, which are connected to the second bit line and store predetermined data;
    a sense amplifier, which is connected to the one end of the first bit line and the one end of the second bit line, and which amplifies data which have been stored at the first memory cells and the second memory cells;
    a latch circuit, which is connected to the other end of the first bit line, and which latches data that the sense amplifier has amplified;
    a data bus, which transfers data which are to be stored at the first memory cells and the second memory cells; and
    a first switch, which is connected to the other end of the second bit line and which switches between connecting and not connecting the second bit line with the data bus.

2. The ferroelectric memory device according to claim 1, further comprising:
    a first dummy cell, which is connected to the first bit line, between the sense amplifier and the first memory cells; and
    a second dummy cell, which is connected to the second bit line, between the sense amplifier and the second memory cells,
    wherein the sense amplifier amplifies data which have been stored at the first memory cells by reference to the second dummy cell, and amplifies data which have been stored at the second memory cells by reference to the first dummy cell.

3. The ferroelectric memory device according to claim 1, further comprising a second switch, which is provided between the first bit line and the latch circuit,
    wherein the first switch is turned on when the sense amplifier amplifies data which have been stored at the first memory cells,
    and the second switch is turned on when the sense amplifier amplifies data which have been stored at the second memory cells.

4. A display-driving IC comprising the ferroelectric memory device of claim 1.

5. A ferroelectric memory device comprising:
    a first bit line which extends, from one end toward another end thereof, in a first direction;
    a plurality of first memory cells, which are connected to the first bit line and store predetermined data;
    a second bit line which extends, from one end toward another end thereof, in a second direction, which is a direction substantially opposite to the first direction;
    a plurality of second memory cells, which are connected to the second bit line and store predetermined data;
    a first sense amplifier, which is connected to the one end of the first bit line and the one end of the second bit line, and which amplifies data which have been stored at the first memory cells and the second memory cells;
    a third bit line which extends, from one end toward another end thereof, in the first direction;
    a plurality of third memory cells, which are connected to the third bit line and store predetermined data;
    a fourth bit line which extends, from one end toward another end thereof, in the second direction;
    a plurality of fourth memory cells, which are connected to the fourth bit line and store predetermined data;
    a second sense amplifier, which is connected to the one end of the third bit line and the one end of the fourth bit line, and which amplifies data which have been stored at the third memory cells and the fourth memory cells;
    a latch circuit, which is connected to the other end of the first bit line, and which latches data that either of the sense amplifiers has amplified; and
    a switch, which is connected to the other end of the second bit line and the other end of the third bit line, and which switches between connecting and not connecting the second bit line with the third bit line.

6. The ferroelectric memory device according to claim 5, further comprising:
    a data bus, which transfers data which are to be stored at the first, second, third and fourth memory cells;
    a first switch, which is connected to the other end of the fourth bit line and which switches between connecting and not connecting the data bus with the fourth bit line; and
    a second switch, which is provided between the first bit line and the latch circuit.

7. The ferroelectric memory device according to claim 5, further comprising:
    a first dummy cell, which is connected to the first bit line;
    a second dummy cell, which is connected to the second bit line;
    a third dummy cell, which is connected to the third bit line; and
    a fourth dummy cell, which is connected to the fourth bit line,
    wherein the first sense amplifier amplifies data which have been stored at the first memory cells by reference to the second dummy cell, and amplifies data which have been stored at the second memory cells by reference to the first dummy cell,
    and the second sense amplifier amplifies data which have been stored at the third memory cells by reference to the fourth dummy cell, and amplifies data which have been stored at the fourth memory cells by reference to the third dummy cell.

8. A display-driving IC comprising the ferroelectric memory device of claim 5.

9. A ferroelectric memory device comprising:
a first bit line which extends, from one end toward another end thereof, in a first direction;
a plurality of first memory cells, which are connected to the first bit line and store predetermined data;
a second bit line which extends, from one end toward another end thereof, in a second direction, which is a direction substantially opposite to the first direction;
a plurality of second memory cells, which are connected to the second bit line and store predetermined data;
a first sense amplifier, which is connected to the one end of the first bit line and the one end of the second bit line, and which amplifies data which have been stored at the first memory cells and the second memory cells;
a third bit line which extends, from one end toward another end thereof, in the first direction;
a plurality of third memory cells, which are connected to the third bit line and store predetermined data;
a fourth bit line which extends, from one end toward another end thereof, in the second direction;
a plurality of fourth memory cells, which are connected to the fourth bit line and store predetermined data;
a second sense amplifier, which is connected to the one end of the third bit line and the one end of the fourth bit line, and which amplifies data which have been stored at the third memory cells and the fourth memory cells;
a data line, which extends, from one end toward another end thereof, in the first direction, is connected to the first sense amplifier via a switch, and is connected to the second sense amplifier via a switch; and
a latch circuit, which is connected to the other end of the data line, and which latches data that either of the sense amplifiers has amplified.

10. The ferroelectric memory device according to claim 9, further comprising:
a data bus, which transfers data which are to be stored at the first, second, third and fourth memory cells;
a first switch, which is connected to the one end of the data line and which switches between connecting and not connecting the data line with the data bus; and
a second switch, which is provided between the data line and the latch circuit.

11. The ferroelectric memory device according to claim 9, further comprising:
a first dummy cell, which is connected to the first bit line;
a second dummy cell, which is connected to the second bit line;
a third dummy cell, which is connected to the third bit line; and
a fourth dummy cell, which is connected to the fourth bit line,
wherein the first sense amplifier amplifies data which have been stored at the first memory cells by reference to the second dummy cell, and amplifies data which have been stored at the second memory cells by reference to the first dummy cell,
and the second sense amplifier amplifies data which have been stored at the third memory cells by reference to the fourth dummy cell, and amplifies data which have been stored at the fourth memory cells by reference to the third dummy cell.

12. A display-driving IC comprising the ferroelectric memory device of claim 9.

\* \* \* \* \*